(12) United States Patent
Visalli et al.

(10) Patent No.: US 7,424,068 B2
(45) Date of Patent: Sep. 9, 2008

(54) METHOD AND SYSTEM FOR CODING/DECODING SIGNALS AND COMPUTER PROGRAM PRODUCT THEREFOR

(75) Inventors: Giuseppe Visalli, Messina (IT); Francesco Pappalardo, Paternò (IT); Giuseppe Avellone, Palermo (IT); Francesco Rimi, Alcamo (IT); Agostino Galluzzo, Palma di Montechiaro (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 844 days.

(21) Appl. No.: 10/930,715

(22) Filed: Aug. 30, 2004

(65) Prior Publication Data

US 2005/0078770 A1 Apr. 14, 2005

(30) Foreign Application Priority Data

Oct. 13, 2003 (EP) ................................ 03425662

(51) Int. Cl.
*H03D 3/18* (2006.01)

(52) U.S. Cl. ..................... 375/327; 375/279; 375/316; 375/323; 375/329; 375/341; 375/342; 375/346; 375/373; 375/376

(58) Field of Classification Search ................ 375/279, 375/323, 341, 342, 346, 373, 376, 324, 325, 375/327, 329
See application file for complete search history.

(56) References Cited

U.S. PATENT DOCUMENTS 4,482,869 A 11/1984 Hirata (Continued)

FOREIGN PATENT DOCUMENTS

EP 0 317 127 11/1988

(Continued)

OTHER PUBLICATIONS

A. J. Macdonald, et al., "PLL Synchronization for Coded Modulation", Electrical, Computer, and Systems Engineering Department, Rensselaer Polytechnic Institute, Troy, NY, Jun. 23-26, 1991, Proceedings of the International Conference on Communications, IEEE, US. vol. 1, Jun. 23, 1991, pp. 1708-1712, New York.

(Continued)

*Primary Examiner*—Shuwang Liu
*Assistant Examiner*—Kabir A Timory
(74) *Attorney, Agent, or Firm*—Hogan & Hartson LLP

(57) ABSTRACT

A method for decoding signals with encoded symbols over a symbol interval that modulate a carrier. The method includes phase locking the signal to be decoded to obtain a phase-locked signal. The value assumed by the phase-locked signal on at least one subinterval in each symbol interval is detected. The method continues with attributing to the decoded symbol corresponding to each symbol interval a value that is a function of the value detected the subinterval. The subinterval in question can be a single subinterval located at the end of the symbol interval. Alternatively, the value assumed by the phase-locked signal on a plurality of subintervals in each symbol interval is detected, and a respective majority value of said phase-locked signal within said plurality of subintervals is identified. A value determined on the basis of the majority value is attributed to the decoded symbol corresponding to each symbol interval.

50 Claims, 4 Drawing Sheets

U.S. PATENT DOCUMENTS

| | | | |
|---|---|---|---|
| 4,584,695 A | | 4/1986 | Wong et al. |
| 4,609,886 A | | 9/1986 | Takaki et al. |
| 4,709,378 A | * | 11/1987 | Wouda et al. ............... 375/361 |
| 4,918,709 A | * | 4/1990 | Fitch .......................... 375/328 |
| 5,666,387 A | | 9/1997 | Tamamura et al. |
| 5,852,630 A | * | 12/1998 | Langberg et al. ............ 375/219 |
| 5,943,382 A | | 8/1999 | Li et al. |
| 6,167,245 A | | 12/2000 | Welland et al. |
| 6,359,949 B1 | | 3/2002 | Okada et al. |
| 6,396,354 B1 | | 5/2002 | Murayama et al. |
| 6,542,038 B2 | | 4/2003 | Nishimura et al. |
| 7,161,995 B1 | * | 1/2007 | Mazahreh et al. ........... 375/341 |

FOREIGN PATENT DOCUMENTS

| | | |
|---|---|---|
| EP | 0 369 406 | 11/1989 |

OTHER PUBLICATIONS

Serizawa, et al. "Phase-Tracking Viterbi Demodulator", Electronics & Communications in Japan, Part I—Communications, Scripta Technica, 1996, pp. 82-96, vol. 79, No. 1, New York.

EP 03425662 European Search Report, Mar. 30, 2004.

FITZ; "A Bit Error Probability Analysis of a Digital PLL Based Demodulator of Differentially Encoded BPSK and QPSK Modulation", IEEE Trans. On Communications, vol. 42, No. 1, Jan. 1994.

\* cited by examiner

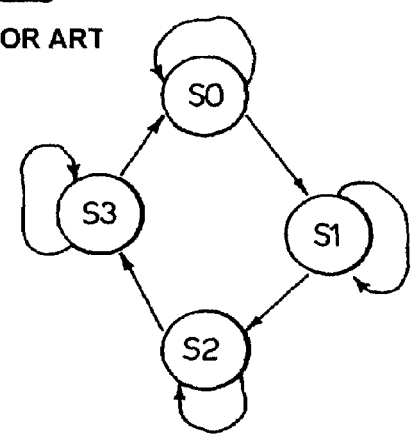
Fig_1 PRIOR ART
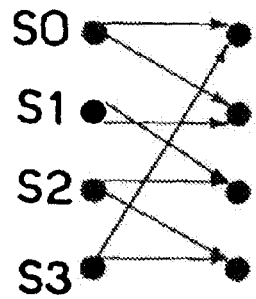
Fig_2 PRIOR ART
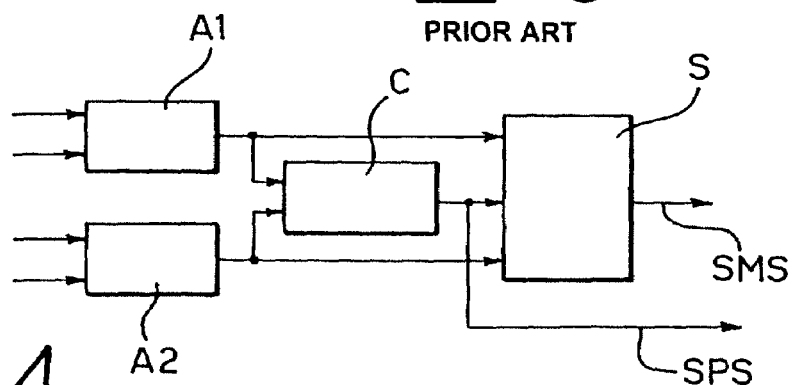
Fig_3 PRIOR ART
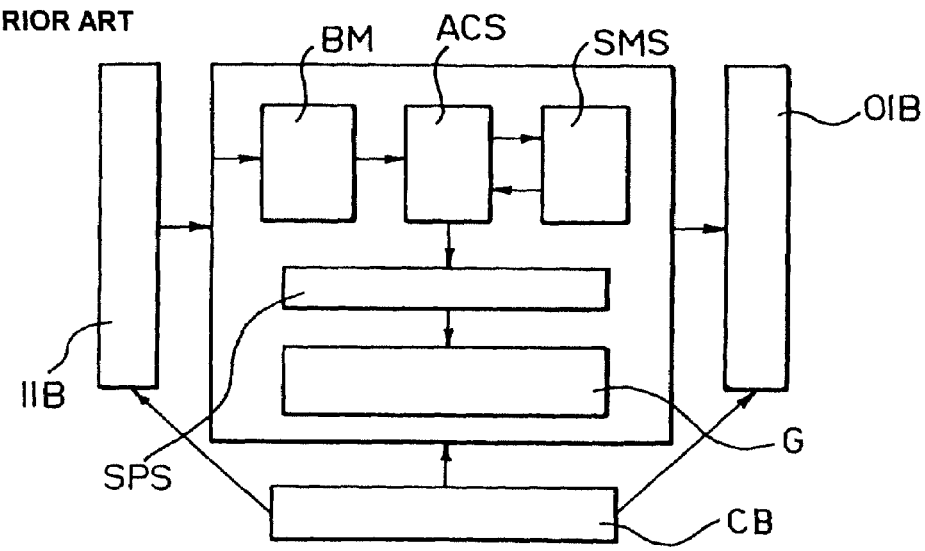
Fig_4 PRIOR ART

Fig_5
PRIOR ART
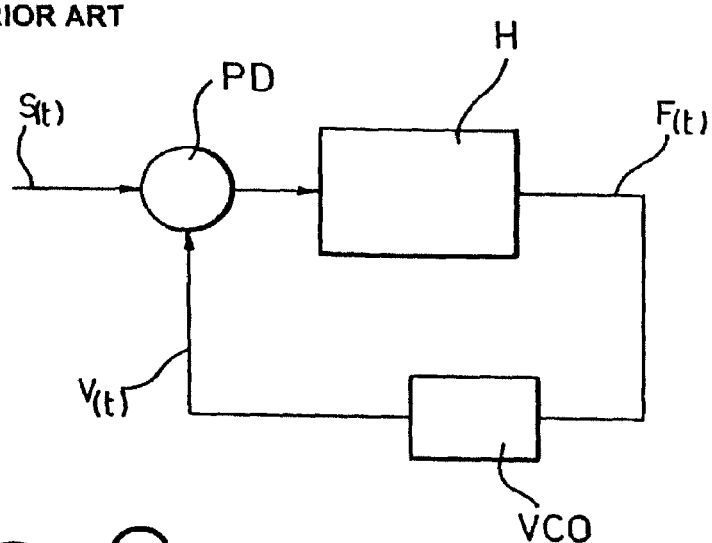
Fig_6
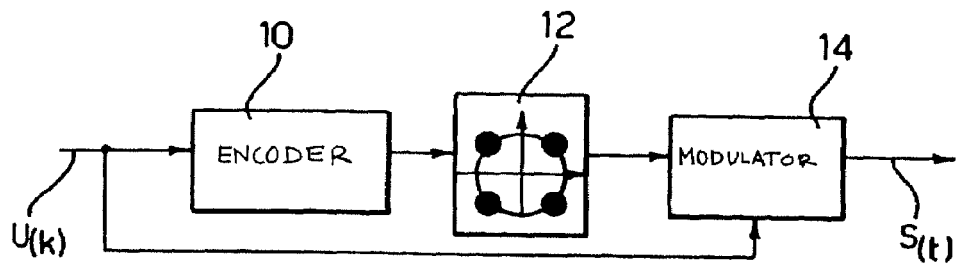
Fig_7
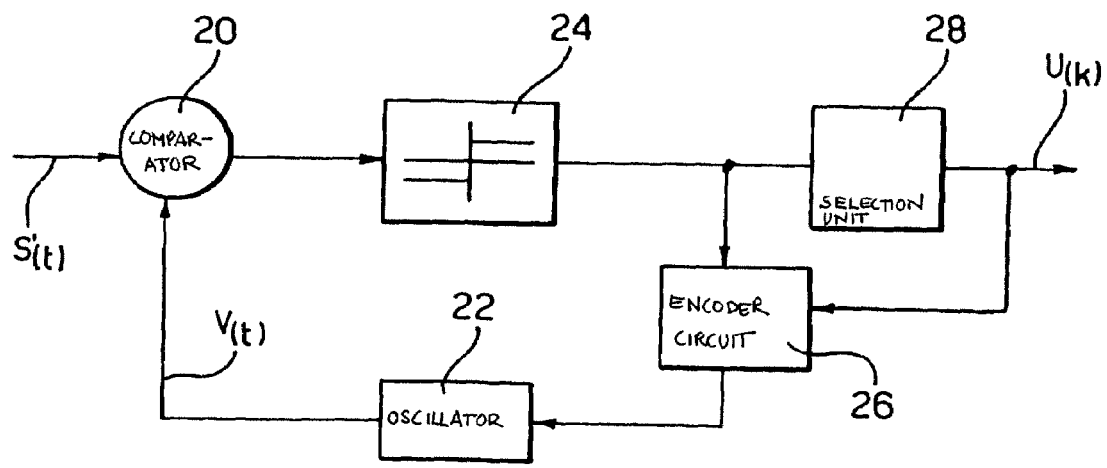

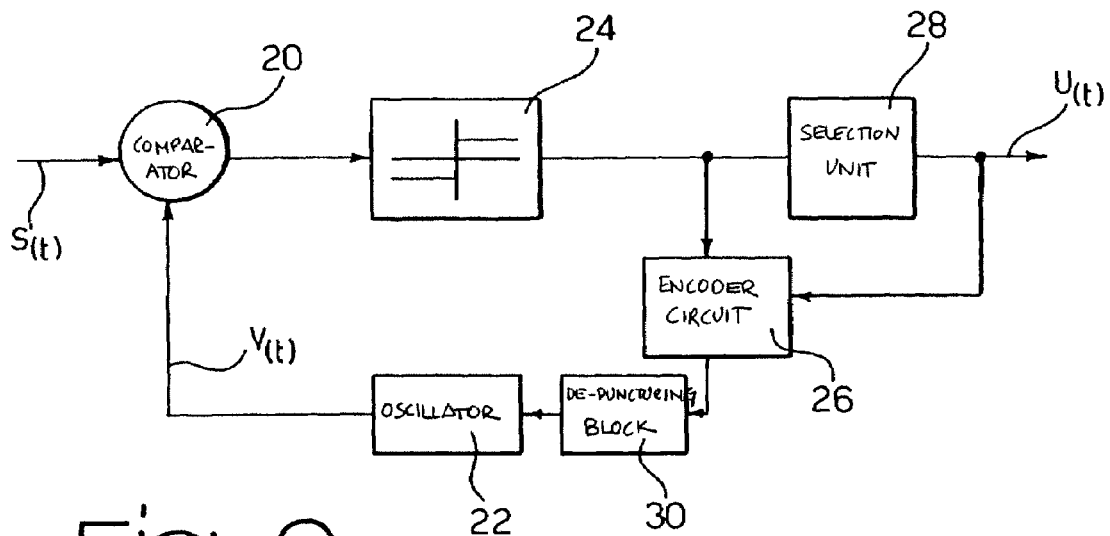
Fig_8
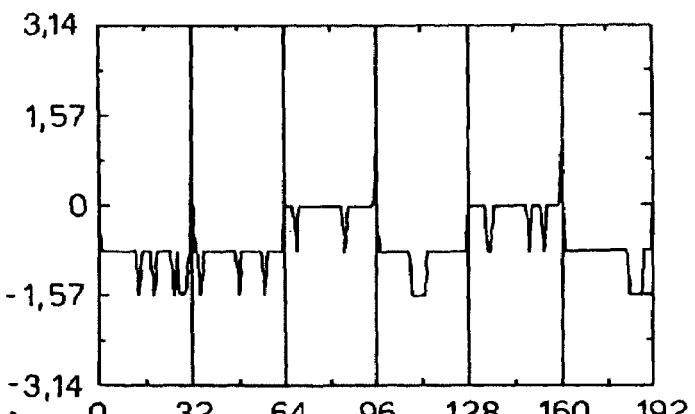
Fig_9
Fig_11

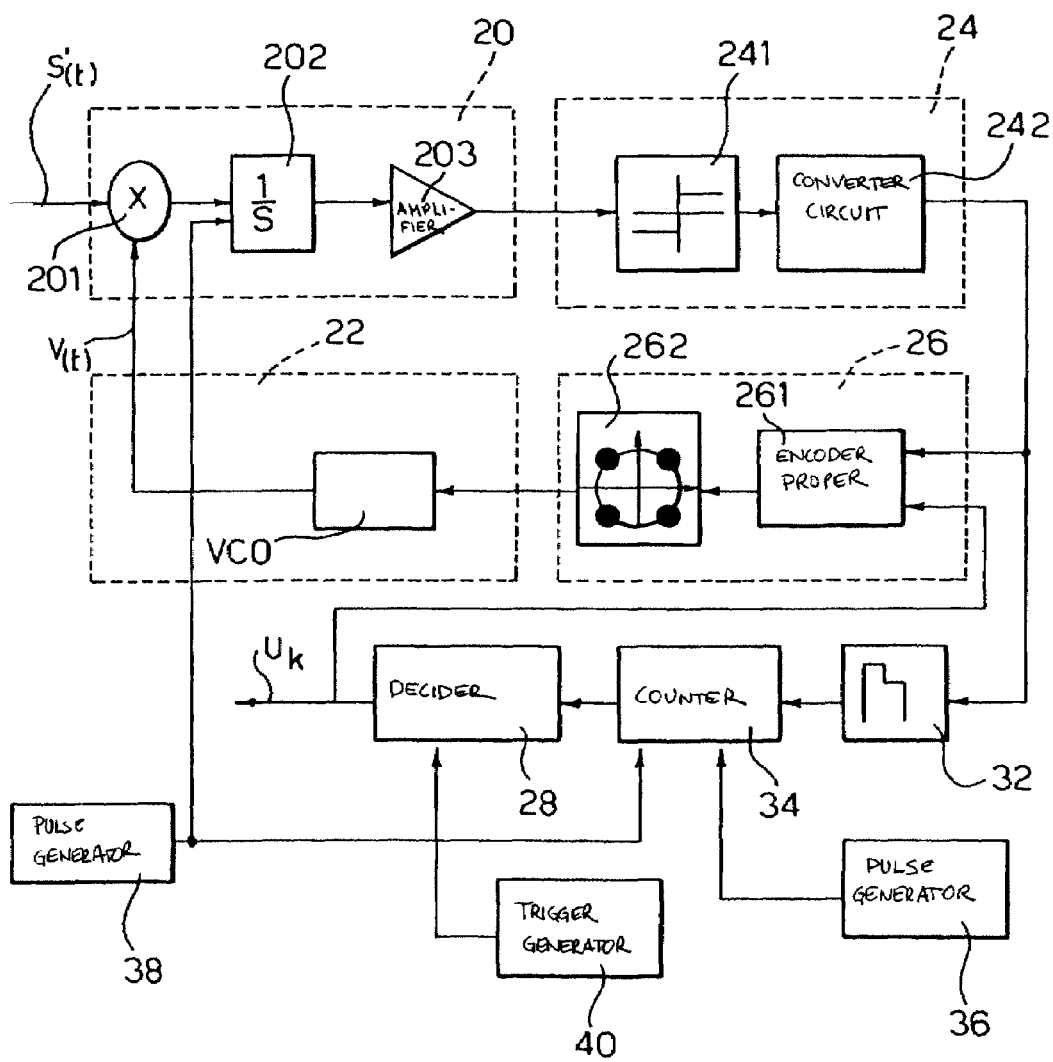
Fig_10

METHOD AND SYSTEM FOR CODING/DECODING SIGNALS AND COMPUTER PROGRAM PRODUCT THEREFOR

FIELD OF THE INVENTION

The present invention relates to techniques for coding/decoding signals.

BACKGROUND OF THE INVENTION

Coded transmissions form part of a consolidated theory of electrical transmissions.

Basically, coding seeks to introduce a redundancy in the transmission in order to enable identification and correction of a decoding error. Redundancy implies a greater occupation of band used and higher transmission costs.

A code with memory can be viewed as a finite-state machine that receives as input $K_0$ bits and produces as output symbols on No bits. The ratio $K_0/N_0$ takes the name of "code rate".

The use of a system with memory involves the symbol as output from the encoder having a certain degree of correlation with the symbols that precede it. This characteristic can be exploited by the decoder in the step of estimation of the transmitted symbol.

The technical literature regarding codes is extremely extensive. The first codes to be introduced were block codes, and a particularly effective development of coding techniques is represented by convolutional codes. A convolutional code is characterized not only by the parameters $N_0$ and $K_0$ already mentioned previously but also by a further parameter N, which enables the number of encoder states to be determined. A convolutional code can thus be viewed as a partially connected graph of the type represented in FIG. 1. The degree of connection of the graph affects the capacity of the code to detect and correct errors.

An alternative representation of the code uses a trellis of the type represented in FIG. 2. The evolution in time of the encoded transmission can hence be viewed as proceeding along the trellis according to a particular path.

One of the most widely known coding/decoding algorithms, which for this very reason does not require any detailed presentation herein, is the algorithm known as Viterbi algorithm. A Viterbi decoder seeks to estimate the "most likely" path.

The evolution of a code, viewed as a time-discrete system, is in fact given by a response of the state, which enables calculation of the subsequent state on the basis of the knowledge of the current state and of the current input, and by a response of the output, which depends upon the current state and the current input.

The theory of electrical communications is founded upon the idea that any optimal (or sub-optimal) receiver "observes" a datum at input, seeking to maximize the a posteriori probability of the datum observed with respect to an attempt sequence. What is observed is a random quantity, linked to the presence of the given signal and the random noise due to the interference sources.

Generally, these two quantities are added algebraically, and in the literature, there has been proposed a wide variety of models of possible sources of noise. The most simple of all is white Gaussian noise (WGN), the probability density of which assumes a form that is convenient for carrying out calculations.

In different applications, in particular of earth communications, the source of interference is not additive, but instead multiplicative, with a probability distribution which, in the far from rare case of a number of sources of interference, assumes a form that is by no means easy to simplify.

The Viterbi decoder, already cited previously, is a somewhat complex circuit that carries out convolutional decoding. There exist numerous circuits for telecommunications that exploit the corresponding technique. In particular, the problem of maximization of the a posteriori probability density is seen, in a sub-optimal way, in the observation of a limited window of the trellis. The probability density is viewed as a sum of partial quantities at each step (accumulated metrics), and the Viterbi circuit constructs at each step the partial paths (i.e., the survived ones) that converge in each state of the trellis.

The optimal path passes through one of these survived paths, and, at the subsequent step, for each state of the trellis, the Viterbi decoder selects the $2^{K_0}$ survived paths that converge in the state considered. For each of these, it calculates the new metrics as sum of the previous metrics, plus the individual contribution (branch metrics) due to the transition to the state considered from the step prior to the current one.

The new survived path will be the one that, between the $2^{K_0}$ survived paths, will have totalized a maximum, or minimum, metric. The theory of the maximum-likelihood decision involves in fact maximization of the a posteriori probability. According to the structure of the statistics of the signal received, the maximization of this probability may involve the search for the maximum or minimum metric (for example, according to a sign which can modify the direction of the search).

The use of a Viterbi decoder entails some difficulties of implementation. The operation of a Viterbi decoder can be viewed as being such as to involve the application of three operations:

the sum between the accumulated metric and the branch metric (addition function or ADD);

a comparison for choosing the maximum metric (comparison function or COMPARE); and the selection of the optimal survived path (selection function or SELECT).

From the standpoint of the circuit construction (see FIG. 3), this usually involves the use of two adder blocks A1, A2, a comparator block C, and a selector block S. The corresponding outputs are constituted by a first line that goes from the selector S to the block SMS for updating the metric of the states (FIG. 4) and by a second line that goes from the output of the comparator C to the block SPS for storage of the survived paths (not illustrated in FIG. 3 but shown in FIG. 4).

The complex of elements illustrated, which forms what is commonly referred to as an add-compare-select (ACS) unit, operates with a floating-point arithmetic (such as IEEE-754) on 64 precision bits.

There is then required a circuit that calculates the branch metrics, a trellis, and finally, a circuit for updating the trellis, which is commonly referred to as TRACEBACK.

The architecture of a traditional Viterbi decoder is reproduced in FIG. 4. In the corresponding block diagram, there may be seen the ACS unit, illustrated in detail in FIG. 3, together with the memory for the metric of the states SMS, the branch metric circuit BM, and the memory for the survived paths SPS. There is also provided a generator of the decoded output sequences, designated by G. These blocks are combined with an input interface block IIB, an output interface block OIB, and a control block CB.

The Viterbi circuit is one of the most widely known solutions, and this fact renders superfluous any detailed description of the mode of interaction between the various blocks represented in FIG. 4. What is interesting to note in the context of the present description is that the architecture represented in FIG. 4 involves a very considerable consumption of resources in terms of area occupied and power absorption.

The performance of a Viterbi decoder usually depends upon the selection of the calculation of the branch metric, which is in turn linked to the model of random process by which the signal received is represented. Operating on a Gaussian channel, the metric usually considered to be best is the Euclidean one.

Since it has been developed paying significant attention to disturbance represented by additive white Gaussian noise (AWGN), the performance of the Viterbi decoder is to a certain extent impaired in the application in a noisy environment affected by fading phenomena and/or multipaths.

For reasons that will become clear in what follows, it is convenient at this point to refer to another well-known classic circuit in the sector of communications technology (and not only communications technology), namely, the circuit commonly referred to as phase-locked loop (PLL). The basic scheme of a classic PLL (a circuit which originally appeared in the analogical-electronics sector, for example for detecting carriers in analogical modulations, generating or aligning sync signals, controlling the speed of rotating members, and the like) is given in FIG. 5.

The main components of a classic PLL are represented by a phase detector PD, a loop filter H, and a voltage-controlled oscillator VCO. Basically, the phase detector PD has the task of extracting the phase difference between the two waveforms at its inputs, constituted, respectively, by a signal S(t) to be locked and by a signal at output V(t) from the oscillator VCO. A possible architecture of the phase detector PD envisages the presence of a multiplier and a low-pass filter set cascaded to one another. At output from the multiplier there is a dc component proportional to the cosine of the phase difference, and a component with a frequency $2\omega$, which is to be eliminated by the low-pass filter.

The oscillator VCO is an oscillator of which the instantaneous oscillation frequency can be controlled as a function of an input signal. In the example illustrated herein, the signal which drives the VCO is the signal F(t) present at output from the filter H. This is usually a low-pass filter of order N (number of stable poles), which identifies also the order of the PLL.

The corresponding literature is extremely extensive and covers a practically infinite range of possible variants of embodiment, comprising non-linear and/or partially or totally digital implementations. Essentially, it will suffice to recall that in a scheme like the one represented in FIG. 5, the input signal, which can be expressed in general as:

$$S(t) = V_0 \cos(\omega t + \alpha(t))$$

is compared with the reference oscillation coming from the oscillator VCO:

$$V(t) = V_{VCO} \cos(\omega t + \beta(t))$$

The low-pass filter H produces at output a signal proportional to the phase difference between the two signals:

$$F(t) = V \cos(\alpha(t) - \beta(t))$$

which can trigger within the PLL a negative reaction such as to cause it to lock, in the steady-state condition, the phase of the input signal, i.e., with $\beta(t)$ substantially equal to $\alpha(t)$.

As has already been said, the technical literature on the subject of PLLs (also for applications only marginally related to phase and/or frequency locking of an input signal) is in effect vast. By way of example, U.S. Pat. Nos. 4,482,869; 4,584,695; 4,609,886; 5,666,387; 5,943,382; 6,167,245; 6,359,949; 6,396,354; and 6,542,038 and the article by M. P. Fitz: "A Bit Error Probability Analysis of a Digital PLL Based Demodulator of Differentially Encoded BPSK and QPSK Modulation", IEEE Trans. on Communications, vol. 42, No. 1, January 1994, all address the subject of PLLs and the design and use of PLLS.

SUMMARY OF THE INVENTION

The present invention provides an improvement in coding/decoding techniques (in particular as regards decoding), which will be able to overcome some intrinsic limitations. For example, the present invention reduces the complexity and burdensomeness of construction of traditional circuits such as the Viterbi circuit while achieving improved performance in the presence, for example, of very noisy channels and/or channels affected by disturbance phenomena, which cannot be put down to the traditional model of Gaussian noise of an additive type.

According to the present invention, these improvements are achieved with a method and system having the characteristics detailed specifically in the ensuing claims. The invention relates also to the corresponding computer-program product, which can be loaded into the memory of a computer (such as a processor) and contains portions of software code for implementing the method according to the invention when the product is run on a computer. In this context, by the term "product" is meant a means which can be read by a computer and comprises instructions for controlling a computer system for the purpose of implementing a method according to the invention.

Essentially, the solution described herein is based upon the general principle according to which the presence of a code with memory enables an improvement in the performance of a receiver if circuits that can exploit the preceding samples of the signal are used.

In particular, the Viterbi circuit examined previously can be viewed as a feedback circuit. Consequently, in the presence of a numeric modulation where the code affects (directly or indirectly) the carrier phase, it is possible to use a PLL for the purpose of locking the waveform and eliminating the transmission code. This mode of operation is rather advantageous in the presence of very noisy channels, where the conventional techniques operating at symbol time (or rate) are not able to detect fast variations of the interference.

For the above reasons, one preferred embodiment of the invention aims at performing decoding of signals that comprise symbols encoded on a respective symbol (or signalling) interval, which modulate a carrier. The method envisions performing a phase locking of the signal to be decoded so as to obtain a phase-locked signal which can be present during each symbol interval, variations induced by the disturbance (noise, fading, etc.) that affects the signal to be decoded. In each symbol interval, the values of the phase-locked signal are detected, and a value determined according to the phase-locked signal is attributed to the decoded signal.

BRIEF DESCRIPTION OF THE DRAWINGS

The invention will now be described, purely by way of non-limiting example, with reference to the annexed drawings, in which:

FIGS. 1 to 5, corresponding to the known art, have already been described previously;

FIGS. 6 and 7 are two block diagrams of a transmitter circuit and a receiver circuit, respectively, operating according to the solution described herein;

FIG. 8 is a block diagram of a variant embodiment of a receiver operating according to the solution described herein;

FIG. 9 is a diagram exemplifying the performance of the solution described herein;

FIG. 10 is a block diagram that illustrates a further development of the solution described herein; and FIG. 11 is a time diagram illustrating the operation of the solution represented in FIG. 10.

DETAILED DESCRIPTION OF PREFERRED EMBODIMENTS

Herein, reference will be made to an exemplary embodiment of the solution described in which the source of information is encoded with a convolutional code that alters the initial phase of a carrier. The signal transmitted in the interval [kT, (k+1)T] will be in the form:

$$S(t) = A \cdot u_k \cos(\omega \cdot t + \Phi_k)$$

In particular, $u_k$ is the information symbol (of a bipolar or antipodal type) which can assume the values [−1, +1]. The initial phase $\Phi$ is obtained from a PSK mapping of the symbol at output from the encoder belonging, for example, to the set [0, 1, 2, 3].

A corresponding structure of the transmitter is represented in the block diagram of FIG. 6. In the block diagram, the reference 10 designates an encoder (with rate ½), the reference 12 designates the module that performs the PSK mapping, and the reference 14 designates the modulator proper at the output of which there is present the signal S(t).

Persons skilled in the art will appreciate that the architecture can be generalized if it operates with a code of any rate. If the rate is $K_0/N_0$, it uses an M-PSK mapping, where M has the value of $2^{N_0}$. The source symbols will be $2^{K_0}$ and generate a bipolar structure of the type (+1, −1, +3, −3, and so on).

The block diagram of FIG. 7 relates to a corresponding basic scheme of the receiver, which builds upon and enhances the classic circuit of the PLL. Basically, the low-pass filter is eliminated, and the code used in transmission is introduced. There is also added a decider (for example, but not as a limitation, a decider of a "hard" type) for estimating the symbol transmitted.

A traditional coding circuit usually alters its own internal state, and hence, its outputs with a rate referred to as the symbol time T. In contrast, it is envisaged that the circuits of FIGS. 6 and 7 will function in an analogical way in the sense that during the interval [kT, (k+1)T], the analogical variation of the signal at input to the encoder causes alteration of just the output. This behaviour enables phase locking, and hence, decoding during the symbol interval [KT, (k+1)T].

In particular, in the diagram of FIG. 7, the reference number 20 designates a phase comparator (for reference, the block PD of FIG. 5 may be considered) at the inputs of which there are sent, respectively:

the signal to be decoded S'(t), represented basically by the signal transmitted S(t) subject to the alterations linked to the transmission; and a signal V(t) coming from an oscillator 22, basically represented by a VCO (see again, for example, the basic scheme of a PLL of FIG. 5).

The reference number 24 designates the decider (of a hard type), and the reference numbers 26 and 28 designate, respectively, an encoder circuit and a selection unit, which are described in greater detail in what follows.

For an understanding of the operation of the circuit, it is to be assumed that at the instant kT the encoder 26 is in an internal state $S_k$. We shall suppose for the moment that any effects of transmission (disturbance due to thermal noise, multi-path fading, or the like) on the received signal S'(t) are ignored. Hence, assuming that at the corresponding input of the phase comparator 20, there is present a signal identical to the signal S(t) at output from the transmitter illustrated in FIG. 6.

In general, at output from the oscillator 22 there will be present an oscillation with frequency ω and estimated initial phase α, which, if the corresponding PLL is not locked, it is in general other than Φ.

The signal at output from the oscillator 22 can therefore be expressed as:

$$V(t) = A_{vco} \cdot \cos(\omega \cdot t + \alpha)$$

The detector or phase comparator 20 then detects a signal proportional to the phase difference between its two inputs, so that at its output there will be present a signal of the type:

$$V_{PD}(t) = A_{PD} \cdot u_k \cdot \cos(\alpha - \Phi_k)$$

If the hypothesis is made, as it is reasonable, that we are close to the phase-locking condition (α very close to Φ), a threshold decider operating on the output of the phase detector 20 will be, in practice, estimating the source symbol $u_k$.

If $u_k$ belongs to the set [−1, +1], the optimal threshold is 0. Consequently, at output from the circuit decider 24, there is present the estimate of $u_k$. This estimate is applied in an "analogical" manner at input to the encoder 26. The output from the encoder in question depends upon the current state ($S_k$) (which is constant in the course of the individual symbol or signalling interval T) and upon the corresponding analogical input.

The signal at output from the decoder is then allowed to vary within a symbol interval T. This variation is the fruit of the attempt of the phase-locking circuit represented in FIG. 7 to phase-lock, removing the encoding represented by the factor Φ. At output from the encoder 26, there will then be present the new (estimated) value of α. This feedback circuit enables phase-locking, which causes α to be equal to the initial phase of the transmitted oscillation.

In a simplistic way, to implement a decoding operation, it would suffice to observe the signal at output from the decider 24 at the instant (k+1)T and make a final decision on the transmitted symbol $U_k$. In fact, it is possible to adopt more refined strategies. One of these strategies is based upon the observation that the symbol that most probably has been transmitted is the one that—in the signal at output from the decider 24—has a "majority" character, i.e., the one that, in the case of transmission of two symbols, [+1, −1], assumes a given level for a time not shorter than T/2. This concept is even more evident if reference is made to the diagram of FIG. 9, to which we shall return later.

Consequently, by sampling the analogical signal at output from the decider 24 in the interval [kT, (k+1)T], a simple processing unit decides on the symbol transmitted by measuring the frequency of the decisions made by the corresponding threshold circuit. The symbol that has most probably been transmitted is the one that has been selected a larger number of times by the threshold decider. Once the final decision has been made (in a selection circuit 28, the characteristics of which will be described in greater detail in what follows with reference to the diagram of FIG. 10) on the symbol transmitted at step k, the internal state $S_k$ of the encoder 26 in the receiver circuit is updated.

It is to be recalled that the subsequent state of a code (and hence in a finite-state machine or FSM) depends upon the previous state and upon the current input. This fact is highlighted by the block 28 in the diagram of FIG. 7 and by its connection to the encoder 26. The latter thus receives two inputs. The state $S_k$ is constant because it is stored, for example, in a flip-flop.

The circuit represented in FIG. 7 has the characteristic of performing locking always and in every case. This fact may be better understood if we assume once again operation in the absence of noise whether additive or multiplicative. The condition of locking or of the absence of locking may be represented as a two-state Markov chain. The first state represents locking, the second its complement. The probabilities of transition depend upon the model of the signal at input to the threshold decider 24. If the code rate is ½, the two possible phases can be chosen with 90-degree difference. In the case of locking, the model of the signal received is:

$$y_k = \sqrt{E_s} \cdot u_k + n_k$$

where $n_k$ is the Gaussian noise.

In the case of absence of locking, the model of signal received will be:

$$y_k = n_k$$

since the cosine of the difference is zero.

Once the error probability has been calculated in the two cases, the probabilities of transition of the Markov chain are obtained and hence, the locking probability. Then, a parameter p can be determined representing the probability of making a right decision in the locking condition. This quantity is:

$$p = 1 - Q\left(\frac{1}{2} \cdot \sqrt{\frac{E_s}{No}}\right)$$

where Q is the function $$Q(x) = \frac{1}{\sqrt{2 \cdot \pi}} \int_x^\infty e^{-\frac{t^2}{2}} dt$$

If the transmission code rate is ½, then, once the current state has been fixed, only two possible phases can be chosen (as the input symbol varies), i.e., the one that is in actual fact transmitted and the other one. If the oscillator 22 generates in reception an oscillation equal to the transmitted one, the value of the cosine at output from the phase detector 20 is 1. Hence, the threshold decider 24 does not commit any mistake if it confirms the new phase at feedback.

If, hypothetically, the oscillator 22 selects (erroneously) the other phase, a code can be selected in such a way that the phase difference between the transmitted phase and the one generated locally will lead to a cosine that is always positive (or possibly zero; it will be the presence of noise that stabilizes locking). In this way, the decider 24 estimates the source symbol correctly, passing to the phase actually transmitted.

The block diagram of FIG. 8 illustrates a variant system of the system of FIG. 7. The system of FIG. 8 utilizes a so-called "puncturing" technique, with "puncturing" referring to a technique that enables alteration of the rate of a code with memory. In one embodiment, it is operation is assumed to have a convolutional code of rate ⅓. During operation of the illustrated system, a puncturing algorithm can mask one of the three output bits, modifying the rate to ½. This variation of the rate enables faster transmission, in so far as for transmitting each symbol just two bits are used, instead of three. Given the smaller redundancy (i.e., the smaller distance between the symbols of the transmission constellation), the capacity of the code to correct the errors is reduced. In reception, a complementary block is used, referred to as "de-puncturing" block, which readapts transmission to the original rate, enabling decoding of the code.

The system diagram of FIG. 8 shows how such a de-puncturing block, designated by 30, may be inserted in a system similar to the system of FIG. 7 in a position between the output of the encoder 26 and the input of the oscillator 22.

Another possible variant of the basic scheme represented in FIG. 7 adopts a soft-decoding technique. "Soft-decoding" refers to the capacity of a decoder to generate, in addition to the decided symbol, a datum regarding reliability that can be directly linked to the probability that the source symbol has been decoded erroneously (or, in a complementary way, to the probability that the symbol has been decoded correctly). This technique is useful in decoding of concatenated codes, serial concatenated convolutional codes (SCCCs), turbo codes, and other codes.

As regards decoding of concatenated convolutional codes, the traditional receiver according to the known art is represented by two cascaded Viterbi receivers. The internal Viterbi receiver is of the soft-input and hard-output type, whilst the external Viterbi receiver operates with the "hard" decisions of the internal Viterbi decoder. Various versions of a decision circuit of this sort are known in the art. One of the most widely known is the one commonly referred to as Soft Output Viterbi (SOVA). Another technique is the one referred to as symbol-by-symbol MAP decoding.

Alternatively, a modified PLL as illustrated for example in FIG. 7 can be used in this context as internal decoder by varying the threshold decider 24. In fact, this unit, in addition to producing the estimate of the (internal) symbol, calculates the degree of reliability that is to be used by the second stage. If the PLL is locked, the signal at input to the threshold circuit can be expressed as:

$$V_{PD}(t) = A_{PD} \cdot u_k + n_k$$

where $n_k$ represents the Gaussian noise at input to the threshold circuit. The probability that the symbol $u_k$ is erroneously decoded can be expressed as:

$$P_{c,k} = Q(A_{PD}/2\sigma)$$

where σ is the variance of the Gaussian noise and Q is the function:

$$Q(x) = \frac{1}{\sqrt{2 \cdot \pi}} \int_x^\infty e^{-\frac{t^2}{2}} dt$$

From a hard decider we pass, then, to a soft decider, leaving the rest of the circuit unaltered. The decider 24 supplies at output, in addition to the estimate of the received symbol $U_k$, the corresponding probability $P_{c,k}$.

The solution described herein is suited both to reception of transmitted signals on a channel affected substantially by Gaussian noise and to reception of signals on channels subject to the presence of fast multipath fading. For immediate reference, the Gaussian-channel model implies that the received signal be in the form:

$$r(t)=V_0\cos(\omega t+\alpha(t))+N(t)$$

where N(t) designates an uncorrelated Gaussian process. The noise is of the additive type (AWGN).

In the case of a channel subject to fast fading, the signal received can be expressed in the form:

$$r(t)=V_0\cos(\omega t+\alpha(t))\cdot M(t)+N(t)$$

where M(t) designates a Rayleigh process. This means that, once t has been fixed, M(t) is a random variable distributed according to a law of the type:

$$f_M(m)=(m/\sigma)\cdot\exp(-m^2/\sigma^2)\cdot u(m)$$

where the function u(m) is 1 for m>0 and 0 otherwise.

Experiments have shows that, in the presence of a Gaussian channel, the solution described herein is advantageous above all for low signal-to-noise ratios. In practice, in the presence of marked disturbance, the analogical circuit has a better performance than a traditional Viterbi decoder because it observes the continuous signal during the interval [kt, (k+1)T]. The Viterbi decoder, in contrast, operates on signals sampled at the instants kT and (k+1)T. This means that, in the presence of very noisy signals, the solution described herein degrades the performance to a smaller extent than a traditional Viterbi decoder.

In the case, instead, of a channel affected by fast fading, the performance of the system described herein is consistently better than that of a Viterbi decoder, in particular of the soft type. This has been confirmed by the inventors in different contexts, for example with reference to channels affected by three-ray and six-ray fast fading, with speeds of 200 km/h and 100 km/h, respectively.

FIG. 9 illustrates, again with reference to a channel affected by fast fading, the performance of the solution described herein with reference to the trend of the detected phase difference (ordinate) as a function of time (abscissa, in which each symbol is represented by 32 samples). FIG. 9 highlights how convenient it is to sample the signal at output from the decider 24 with a period constituting a submultiple of the signalling interval. In particular the first, second, fourth and sixth symbols are very likely estimated correctly. The phase difference in these cases is in fact 0 for a period of time longer than T/2.

The block diagram of FIG. 10 (in which for immediate reference uses the same references used in FIGS. 7 and 8) illustrates in greater detail a possible structure of receiver circuit obtained according to the solution described herein. In particular, the phase detector 20 is obtained using three blocks, namely:
- a multiplier 201, which receives at its inputs the signals S'(t) and V(t);
- an integrator 202, which operates on the output of the multiplier 201; and
- an amplifier circuit 203, which operates on the output of the integrator 202.

The integrator circuit 202 is provided with a reset terminal driven by a block 38 described in greater detail in what follows, which has the function of discharging the circuit at each symbol or signalling interval T so as to ensure a correct operation of the entire receiver. Persons skilled in the art will, of course, appreciate that the solution just described is not the only one possible for obtaining the phase detector. In particular, the literature provides different solutions of filters capable of removing the component having twice the frequency: low-pass filters (Butterworth, Chebycheff, Elliptical, and the like) or band-stop filters.

The decider 24 comprises a threshold circuit 241 that supplies decisions of a hard type at output from the phase detector (in the specific case at output from the amplifier 203). The decisions in question, in the [−1, +1] format, are supplied to a converter circuit 242, which converts the signal in antipodal format at output from the circuit 241 into a normal binary [0,1] format. This signal is fed back, as already described, with the internal encoder 26 designed to generate the new value of the phase of the signal at output from the oscillator 22.

With reference to FIG. 6, it will be appreciated that the encoder 26 is represented by an encoder proper 261 (acting on an internal code according to the output of the hard detector 24 and of the decider 28, which will be described in greater detail in what follows) and by a PSK-mapping module 262, which can be substantially likened from the functional standpoint to the module 12 of FIG. 6. It will be appreciated that, in the most general terms, the solution described herein is based upon the use of a modified phase-locked loop, in which the structure of the code is repeated in reception to enable decoding of the transmitted signal. Moreover, there is introduced in reception an encoder model, which, although virtually different from the one used in the transmission circuit, in actual fact has the same circuit structure and supplies the same response of the state and of the output.

As already mentioned previously, a code is nothing but a time-discrete linear system with memory (finite automaton). It is characterized by a response of the state and a response of the output. The response of the state is governed by a difference equation of the form:

$$x(k+1)=A\cdot x(k)+B\cdot u(k)$$

The response of the output is a simple linear equation:

$$y(k)=C\cdot x(k)+D\cdot u(k)$$

The matrices A, B, C, D have constant terms if the system is stationary. From the circuit standpoint, this system can hence be seen as the combination of two circuits: the first calculates the state at step k+1, and the second calculates the output.

In traditional systems, both networks receive the input signal u(k) which is time-discrete (in this connection, see FIG. 1). The solution described herein envisages, instead, supplying the network that calculates the output with an analogical signal u(t) and supplying the network that calculates the subsequent state with a time-discrete signal u(k).

A "modified" circuit of this sort has a behaviour identical to that of the original one if u(t) is piecewise constant and equal to u(k) in the interval [kT, (k+1)T]. This new type of encoder (basically the module 26) is supplied in its analogical component by the estimate of the current source symbol (output of the threshold decider). The fact that the input is analogical enables variation of the output according to the degree of locking of the loop (the state is constant). The numeric input to this new encoder comes from the circuit 28, which makes the final decision on the transmitted symbol $u_k$. This functionality enables the internal state of the code to be updated and the entire circuit to be prepared for decoding of the next symbol.

As has been said previously, the encoder 10 is different from the encoder 26. The encoder 10 expresses, in fact, a traditional code, i.e., an FSM the evolution of which can be described in the discrete time. The code 26 regards instead the operation of the code itself forcing the "analogical" inputs.

The code 10 is used in transmission whilst the code 26 is used in reception. The encoder 10 hence expresses a "classic" code, whilst the encoder 26 is basically a finite-state machine. In particular, the circuit 10 will usually function in a traditional way. It will likewise be noted that the circuit 26 receives two inputs, whilst the circuit 10 receives only one input.

The signal in binary format at output from block 242 is sampled (see by way of reference in this regard FIG. 9) a certain number of times for making the final decision on the transmitted symbol. For this purpose a sampler 32 of the Zero-Order Hold type is used, at the output of which there is associated a counter 34 driven by a pulse generator 36. The counter 34 increments its internal state whenever the signal at input reaches a threshold value (for example the value 0.5, but it will be appreciated that this choice is not imperative).

Finally, the decider circuit 28 compares the value of the counter 34 with an internal threshold. For example, the threshold will be equal to 64, if it is sampled 128 times in the symbol interval. Usually, the chosen threshold in question is equal to half the number of samples within the symbol interval. At output from the decider 28 there is therefore obtained the final symbol $u_k$, which is also used by the encoder 26 (in particular by the module 261) for updating its internal state $S_k$ and proceeding to decoding of the next symbol.

The entire receiver circuit is timed by waveform generators. The counter 34 uses a reset pulse, obtained by means of the pulse generator 38, which is active on the first sampling interval. The reset signal itself is also applied to the integrator 202. The counter 34 operates on a time base to enable the count, and this base is provided by the pulse generator 36. This signal has a frequency, for example, 128 times higher than the symbol rate.

Moreover, the decision circuit is activated at the last count, i.e., for example, at sample 127. This is enabled by a further trigger generator 40. The above concept is further highlighted in FIG. 11 where, with reference to a given symbol interval, the reference A designates the instant at which the counter and the integrator are reset, whilst the reference B indicates the instant in which the content of the counter is evaluated, making the final decision on the transmitted symbol. In this connection, it is important to note that, in the example of the illustrated embodiment, the analogical signal at output from the threshold decider 24 is sampled on a plurality of subintervals within the individual symbol interval T.

If, for example, the symbol interval is 1 second (this, of course, is only a deliberately simplified example, provided merely for facilitating the explanation, given that the transmission rates are usually far higher) and sampling is carried out on subintervals of 0.1 seconds, we have 10 samples. If the threshold decider selects $u_k=1$, for example, for at least five times, i.e., for at least five subintervals, the final decision will be 1 (majority value) and −1 otherwise.

The above strategy, of course, admits of different alternatives, not illustrated herein in detail but certainly comprised in the invention. For example, experimentally it has been seen that at the start of the symbol interval T, there are various oscillations because the PLL is not yet locked. Certainly, at the final portion of the symbol interval, this locking is far more probable.

This suggests at least two alternatives to the solution described in detail above. A first alternative envisages limiting the analysis of the samples in a time window shifted to the end of the symbol interval. For example, with reference to the availability of 10 samples obtained on 10 subintervals comprised in the symbol interval T (for instance, on subintervals of 0.1 seconds if T is 1 second) a time window can be considered such as to include, for example, the samples from 6 to 10 and shift accordingly the threshold of choice of the majority value, for example by adopting a threshold value of 2, i.e., (10−6)/2. For the selection of the decision threshold, a value equal or close to the half-sum of the samples is usually justified if the symbols $u_k$ are equiprobable.

In general, the threshold value is chosen according to the a priori distribution of the source symbols $u_k$. In particular this value becomes equal or close to N/2 (half of the samples) in the case of equiprobable symbols. If however, for example, the symbol "1" appears at a frequency of 90%, the threshold should be changed, in the sense that the final decision is made by measuring the occurrences of the symbol "1". As a further alternative, there can be chosen as final source symbol the one assumed in the last subinterval of the symbol interval T (for example, the sample number 10), hence using an observation window of the phase-locked signal limited to just one subinterval or sample, chosen for example as the one having the highest probability of reaching the locking condition.

It is once again emphasized that the range of the decision strategies is not limited to the ones outlined previously (choice based upon the signal at output from the decider 24, upon the majority value over the entire symbol interval or over part thereof) but embraces any solution which, once a signal phase-locked with the received signal has been generated, decides on the output symbol according to the value detected on at least one subinterval of the symbol interval.

The receiver architecture described herein may be used for different applications in the sector of telecommunications. In particular, the circuit described can form part of a receiver operating in frequency-division multiple access (FDMA). In practice, each user transmits at different oscillation frequencies of the carrier with a PSK modulation. The receiver is represented by a bank of PLL circuits of the type described above, and each receiver has a local oscillator (VCO) tuned to the frequency of the individual user.

If the convolutional code has a rate different from ½, a PSK modulation is used with a number of symbols compatible with the possible output of the encoder. If, for example, the operating rate is ⅔, it is possible to use an 8-PSK modulation. At the receiver end, the single-threshold decider is replaced by a multiple-threshold decider (three thresholds, in the case of the example considered), which is capable of choosing the four possible values of the source symbol.

The circuit described is able to decode any code with or without memory (block codes, BCH, Reed-Solomon codes, convolutional codes, turbo-codes). As has been seen, the circuit described can be used for soft decoding in the context of decoding of concatenated convolutional codes and turbo-codes. Basically, the threshold decider of the "hard" type is replaced by a "soft" system, which produces the estimated symbol and the level of confidence thereof as quantities that can be directly linked to the likelihood of the estimate not being correct. In this connection, the quantity commonly indicated as $P_{c,k}$ has been previously cited explicitly. Persons skilled in the art will understand that, in the context of the solution described herein, there may be used any parameter useful for soft decoding that is linkable or otherwise to the quantity $P_{c,k}$.

For example, there exist soft receivers that produce quantities of the type:

$$L_k = \log\left(\frac{1-P_{c,k}}{P_{c,k}}\right)$$

whilst in turbo decoders other quantities are used, according to known criteria which do not need to be recalled herein.

The principle illustrated herein can then be used also for modulations different from a PSK modulation (for example a QAM modulation) operating with an amplitude and phase modulation. The signal that arrives at input to the decider, in addition to comprising the cosine of the phase difference, has in itself a multiplicative constant (the amplitude) that depends upon the symbol of a transmitted channel. In principle, it is always possible to define an optimal decider, the thresholds of which depend upon the structure of the alphabet of the source symbol ($u_k$) and the amplitudes associated to the channel symbols.

It should further be appreciated that the solution described herein constitutes a bridge between a completely digital vision of the problem of decoding of a numeric transmission and the prior techniques developed with reference to analogical modulations. The exemplary embodiment illustrated herein refers, in a non-limiting way, to the use of convolutional codes. It will be appreciated, however, that this solution can be conveniently applied to codes (with or without memory) of any type.

The advantages of the solution proposed are numerous. In particular, the performance in the presence of markedly noisy channels is much better than that of traditional circuits. Furthermore, the solution proposed is of simple construction, since just a few logic gates are required as compared to very complex circuits such as a Viterbi decoder. It is therefore evident that, without prejudice to the principle of the invention, the details of implementation and the embodiments may vary widely with respect to what is described and illustrated herein, without thereby departing from the scope of the invention, as defined by the annexed claims.

We claim:

1. A method for decoding signals comprising symbols encoded on respective symbol intervals that modulate a carrier, comprising:
    performing a phase locking of a signal to be decoded to obtain a phase-locked signal which is present during the symbol intervals variations induced by disturbance affecting the signal to be decoded, wherein said step of performing a phase locking comprises
        comparing a phase of said signal to be decoded with a phase of a reference signal to obtain a respective resulting signal,
        subjecting said resulting signal to a decider to obtain a value of an estimated encoded symbol, and
        generating said reference signal as a signal comprising respective symbols encoded on given symbol intervals that modulate a given carrier, said given symbol intervals and said given carrier being homologous to said symbol interval and to said carrier of the signal to be decoded, respectively, so that a structure of a transmission code is repeated to enable decoding of the signal to be decoded;
    detecting a value of said phase-locked signal on at least one subinterval in each of the symbol intervals; and
    attributing to a decoded symbol corresponding to each of the symbol intervals a value obtained as a function of the value detected on said at least one subinterval.

2. The method of claim 1, wherein said at least one subinterval is at about the end of the symbol interval.

3. The method of claim 2, wherein the detecting the value of said phase-locked signal is performed on a single one of the said at least one subinterval.

4. The method of claim 1, wherein the detecting of the value of said phase-locked signal is performed for a plurality of subintervals in each of the symbol intervals, and the method further comprising:
    identifying a respective majority value of the phase-locked signal within said plurality of subintervals; and
    attributing to the decoded symbol corresponding to each of the symbol intervals a value determined by said respective majority value.

5. The method of claim 4, wherein each of said plurality of subintervals covers substantially all of the corresponding symbol interval.

6. The method of claim 4, wherein each of said plurality of subintervals covers a time window within the corresponding symbol interval.

7. The method of claim 6, wherein said time window is located at the end of the corresponding symbol interval.

8. The method of claim 4, wherein the identifying of said respective majority value comprises:
    defining at least one threshold value for said phase-locked signal; and
    performing, within each of the symbol intervals, a count incremented when said value of said phase-locked signal reaches said threshold value.

9. The method of claim 8, wherein said majority value is determined as absolute majority within said plurality of subintervals and wherein said absolute-majority value is defined with reference to half of the maximum value of said count.

10. The method of claim 4, wherein said majority value is determined as absolute majority within said plurality of subintervals.

11. The method of claim 1, wherein said decision comprises a decision of a hard type.

12. The method of claim 1, wherein said decision comprises a decision of a soft type that can produce the value of the estimated encoded symbol and a corresponding index of probability of the correctness of the value of the estimated encoded symbol.

13. The method of claim 12, wherein the method is integrated as an internal decoding method in a process for decoding signals encoded with concatenated convolutional codes.

14. The method of claim 1, herein said operation of comparing the phase comprises:
    multiplying said signal to be decoded by said reference signal; and
    integrating on said symbol interval the signal resulting from said multiplication.

15. The method of claim 1, wherein the estimated encoded symbols are antipodal and further associating with said decision conversion of the estimated encoded symbols from a bipolar format to a unipolar format.

16. The method of claim 1, wherein said generating said reference signal comprises attributing to said homologous carrier a reference phase given by phase mapping.

17. The method of claim 1, wherein said generating said reference signal comprises using a finite-state machine having a state that is determined at each of the symbol intervals from a value of the state in a preceding one of the symbol intervals and from a value attributed to the decoded symbol corresponding to the preceding one of the symbol intervals.

18. The method of claim 1, wherein the signal to be decoded is subjected to puncturing with variation of rate of coding of said decoded symbols and further wherein the method further comprises performing a complementary function of de-puncturing within said performing said phase locking.

19. The method of claim 18, wherein said de-puncturing is performed downstream of the generating of said respective estimated encoded symbols with the homologous symbol interval.

20. The method of claim 1, wherein the signal to be decoded is encoded with a convolutional code with rate of ½, wherein the detecting of the value of said phase-locked signal is performed with a single threshold.

21. The method of claim 1, wherein the symbol to be decoded is encoded with a convolutional code with a rate different from ½ and wherein the detecting of the value of said phase-locked signal is performed with multiple thresholds.

22. The method of claim 1, wherein said carrier is modulated in phase with the symbols encoded on the signal to be decoded.

23. The method according to any one of the preceding claims, applied to the decoding of signals, in which said carrier is modulated in amplitude and phase by said encoded symbols ($u_k$).

24. The method of claim 1, further comprising generating a signal that can be decoded by the performing, the detecting, and the attributing, the generating of the signal comprising:
generating said encoded symbols with a given rate; and
determining, for each of said symbol intervals, a phase of said carrier by mapping the symbol at output from the generating said encoded symbols.

25. The method of claim 24, wherein said mapping is a PSK mapping.

26. A system for decoding signals that comprise encoded symbols on respective symbol intervals which modulate a carrier, comprising:
a circuit for phase-locking a signal to be decoded to obtain a phase-locked signal which is present during each of said symbol intervals variations induced by perturbations affecting the signal to be decoded, said phase-locking circuit comprising
a comparator comparing a phase of said signal to be decoded with a phase of a reference signal to obtain a respective resulting signal,
at least one decision module subjecting said resulting signal to a decider to obtain a value of an estimated symbol, and
a circuit for generating said reference signal as a signal comprising respective symbols encoded on respective given symbol intervals that modulate a given carrier, said given symbol intervals and said given carrier being homologous to said symbol interval and said carrier of the signal to be decoded, respectively, so that a structure of a transmission code is repeated to enable decoding of the signal to be decoded;
a detection circuit detecting a value of said phase-locked signal on at least one subinterval in each of symbol intervals; and
a selection circuit attributing to a decoded symbol corresponding to each of the symbol intervals a value that is a function of the value detected by the detection circuit on said at least one subinterval.

27. The system of claim 26, wherein said at least one subinterval is located at about the end of the corresponding symbol interval.

28. The system of claim 27, wherein the detection circuit detects the value assumed by said phase-locked signal on a single subinterval located at about the end of the corresponding symbol interval.

29. The system of claim 26, wherein:
said detection circuit is configured for detecting the value assumed by said phase-locked signal on a plurality of subintervals in each of the symbol intervals; and
said selection circuit is configured for identifying a respective majority value of said phase-locked signal within said plurality of subintervals, attributing to the decoded symbol corresponding to each of the symbol intervals a value determined by said respective majority value.

30. The system of claim 29, wherein said plurality of subintervals covers substantially of the corresponding symbol interval.

31. The system of claim 29, wherein said plurality of subintervals covers a time window within the corresponding symbol interval.

32. The system of claim 31, wherein said time window is located at about the end of the corresponding symbol interval.

33. The system of claim 26, wherein said decision module comprises a decision module of a hard type.

34. The system of claim 26, wherein said decision module is a decision module of a soft type which produces a value of estimated encoded symbol and a corresponding index of probability of the correctness of the estimate of said estimated encoded symbol.

35. The system of claim 34, further comprising an internal decoder for signals encoded with concatenated convolutional codes.

36. The system of claim 26, wherein said comparator comprises:
a multiplier operating between said signal to be decoded and said reference signal; and
an integrator operating for said symbol interval on the signal resulting from said multiplier.

37. The system of claim 26, wherein said encoded symbols are of an antipolar type and said decision module has associated thereto a conversion module converting a result of the decision into a unipolar format.

38. The system of claim 26, wherein said circuit for generating said reference signal comprises a mapping module for attributing to said homologous carrier a reference phase resulting from phase mapping.

39. The system of claim 26, wherein said circuit for generating said reference signal comprises a finite-state machine a state of which is determined at each of the symbol intervals from a value of the state in a preceding one of the symbol intervals and from the value attributed to the decoded symbol corresponding to the preceding one of the symbol intervals.

40. The system of claim 29, wherein said system further comprises:
at least one threshold circuit for said phase-locked signal; and
a counter having a count that is incremented whenever said phase-locked signal reaches a threshold value associated with the at least one threshold circuit.

41. The system of claim 40, wherein said detection circuit determines said majority value as absolute majority within said plurality of subintervals.

42. The system of claim 41, wherein said detection circuit is configured for defining said absolute-majority value with reference to half of a maximum count value of said counter.

43. The system of claim 26, wherein the signals that comprise the encoded symbols are subjected to puncturing with variation of rate of coding of the encoded symbols, and further comprising a module with that functions of de-puncturing and that is associated to said phase-locking circuit.

44. The system of claim 43, wherein said de-puncturing module is set downstream of said at least one decision module.

45. The system of claim 26, wherein said symbols are encoded with a convolutional code with a rate of ½ and further comprising a single-threshold decision circuit in the detection circuit.

46. The system of claim 26, wherein said symbols are encoded with a convolutional code with rate different from ½ and wherein the detection circuit comprises a multiple-threshold decision circuit.

47. The system of claim 26, further comprising a system for generating a signal that can be decoded, the system comprising:

a generator of the encoded symbols with a given rate; and
a mapping circuit activatable for each of said symbol intervals for determining the phase of said carrier by mapping of the symbol at output from the coding operation.

48. The system of claim 47, wherein said mapping circuit implements a PSK mapping.

49. A computer-program product that can be loaded into the memory of at least one computer and comprising portions of software code for implementing the method according to claim 1 when the product is run on a computer.

50. A computer-program product loadable into the memory of at least one computer and comprising portions of software code for implementing the method according to claim 1 when the product is run on a computer.

* * * * *